United States Patent
Srinivasarao (10) Patent No.: US 10,916,949 B2
(45) Date of Patent: Feb. 9, 2021

(54) POWER SUPPLY DEVICE AND AN ASSOCIATED METHOD THEREOF

(71) Applicant: GENERAL ELECTRIC TECHNOLOGY GmbH, Baden (CH)

(72) Inventor: Mohan Srinivasarao, Hosur (IN)

(73) Assignee: GENERAL ELECTRIC TECHNOLOGY GmbH, Baden (CH)

(*) Notice: Subject to any disclaimer, the term of this patent is extended or adjusted under 35 U.S.C. 154(b) by 48 days.

(21) Appl. No.: 16/361,647

(22) Filed: Mar. 22, 2019

(65) Prior Publication Data

US 2019/0296558 A1 Sep. 26, 2019

(30) Foreign Application Priority Data

Mar. 23, 2018 (IN) .............................. 201841010800

(51) Int. Cl.
| | |
|---|---|
| H02J 4/00 | (2006.01) |
| G01R 19/25 | (2006.01) |
| H03H 7/01 | (2006.01) |
| G01R 15/06 | (2006.01) |
| H01T 4/02 | (2006.01) |
| H04W 88/08 | (2009.01) |

(52) U.S. Cl.
CPC ................ *H02J 4/00* (2013.01); *G01R 15/06* (2013.01); *G01R 19/2513* (2013.01); *H03H 7/0115* (2013.01); *H01T 4/02* (2013.01); *H04W 88/08* (2013.01)

(58) Field of Classification Search
CPC ....... H02J 4/00; G01R 15/06; G01R 19/2513; H03H 7/0115; H03H 7/01; H01T 4/02; H04W 88/08
See application file for complete search history.

(56) References Cited

U.S. PATENT DOCUMENTS

| | | | | |
|---|---|---|---|---|
| 6,051,796 A | * | 4/2000 | Kuhl | ...................... H01B 17/32 174/179 |
| 6,052,092 A | | 4/2000 | Davis et al. | |

(Continued)

FOREIGN PATENT DOCUMENTS

GB 2335546 A 9/1999

OTHER PUBLICATIONS

Pachauri et al., "Hybrid PV/FC Stand Alone Green Power Generation: A Perspective for Indian Rural Telecommunication Systems", 2014 International Conference on Issues and Challenges in Intelligent Computing Techniques (ICICT), pp. 802-810, 2014.

(Continued)

*Primary Examiner* — Robert L Deberadinis
(74) *Attorney, Agent, or Firm* — Eversheds Sutherland (US) LLP (57) ABSTRACT

A power supply device is presented. The power supply device includes a voltage conversion unit. The voltage conversion unit includes a capacitor divider circuit. The capacitor divider circuit includes a plurality of capacitors coupled to each other in series. Further, the voltage conversion unit includes a step-down transformer coupled to at least one of the plurality of capacitors. The power supply device also includes a low pass filter configured to be coupled to at least one high voltage power line and the voltage conversion unit, where the low pass filter is configured to provide filtered power to the voltage conversion unit.

20 Claims, 4 Drawing Sheets

(56) References Cited

U.S. PATENT DOCUMENTS

| | | |
|---|---|---|
| 8,058,738 B1 | 11/2011 | Bertz |
| 8,456,033 B2 | 6/2013 | Halstead |
| 8,896,497 B1 | 11/2014 | Kullman et al. |
| 9,293,948 B2 | 3/2016 | Freitas et al. |
| 9,466,879 B2 | 10/2016 | Leung et al. |
| 2008/0278295 A1* | 11/2008 | McKenzie ........ H02J 13/00009 340/12.32 |
| 2014/0176336 A1* | 6/2014 | Li .......................... G01R 31/50 340/870.01 |

OTHER PUBLICATIONS

Tong et al., "A Novel Design of Radio Frequency Energy Relays on Power Transmission Lines", Energies, vol. 9, Issue: 06, pp. 1-14, 2016.

\* cited by examiner

POWER SUPPLY DEVICE AND AN ASSOCIATED METHOD THEREOF

FIELD OF INVENTION

Embodiments of the present specification generally relate to power supply systems, and more particularly, to a power supply device and an associated method of operating a power supply system having the power supply device for loads such as telecommunication equipment, for example.

BACKGROUND OF THE INVENTION

In general, telecommunication service providers use existing infrastructure to install telecommunication equipment, such as antennas and the like. In a scenario, when infrastructure is not readily available, land needs to be acquired/leased for setting up a dedicated telecommunication tower for installing the telecommunication equipment, such as antennas. Therefore, installation of a dedicated telecommunication tower is expensive and cumbersome.

It may be noted that continued supply of electrical power is required for operation of telecommunication equipment. Typically, the powering technique for the telecommunication equipment installed on telecommunication tower involves use of diesel generators or renewable power sources, such as solar panels. Operational cost of the diesel generators is high and also, diesel generators contribute towards emission of greenhouse gases. Further, the installation of solar panels is cumbersome. Furthermore, use of diesel generators and solar panels adds to the footprint. Moreover, use of solar panels or diesel generators requires use of battery banks for storing additional generated power or for providing backup power.

Hence, there lies a need for enhanced power supply system for providing high quality uninterrupted power to the telecommunication equipment.

BRIEF DESCRIPTION

In accordance with aspects of the present specification, a power supply device is presented. The power supply device includes a voltage conversion unit. The voltage conversion unit includes a capacitor divider circuit comprising a plurality of capacitors coupled to each other in series. Further, the voltage conversion unit includes a step-down transformer coupled to at least one of the plurality of capacitors. The power supply device also includes a low pass filter configured to be coupled to at least one high voltage power line and the voltage conversion unit, where the low pass filter is configured to provide filtered power to the voltage conversion unit.

In accordance with another aspect of the present specification, a power supply system is presented. The power supply system includes a power supply device. The power supply device includes a voltage conversion unit. The voltage conversion unit includes a capacitor divider circuit. The capacitor divider circuit includes a plurality of capacitors coupled to each other in series. The voltage conversion unit also includes a step-down transformer coupled to at least one of the plurality of capacitors. The power supply device also includes a low pass filter configured to be coupled to at least one high voltage power line and the voltage conversion unit, where the low pass filter is configured to provide filtered power to the voltage conversion unit. The power supply system includes a disconnector switch disposed between the power supply device and the at least one high voltage power line. Further, the power supply system includes a smart meter coupled to the voltage conversion unit.

In accordance with yet another aspect of the present specification, method of operation of a power supply system is presented. The method includes filtering, using a power supply device, a high voltage signal at at least one high voltage power line. Further, the method includes generating, using the power supply device, a low voltage signal based on the high voltage signal. Furthermore, the method includes providing the low voltage signal to a load.

BRIEF DESCRIPTION OF THE DRAWINGS

These and other features and aspects, of the present disclosure will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this disclosure belongs. The terms "first," "second," and the like, as used herein do not denote any order, quantity, or importance, but rather are used to distinguish one element from another. Also, the terms "a" and "an" do not denote a limitation of quantity, but rather denote the presence of at least one of the referenced items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. The term "operatively coupled," as used herein, refers to direct and indirect coupling. Furthermore, the terms "circuit" and "circuitry" and "controller" may include either a single component or a plurality of components, which are either active and/or passive and are connected or otherwise coupled together to provide the described function.

As will be described in detail hereinafter, various embodiments of a power supply system and a method operation of the power supply system are disclosed. The exemplary power supply system may be employed for powering of loads, such as but not limited to telecommunication antennas, other telecommunication electronics, lighting loads, and the like. The exemplary power supply system is configured to tap a high voltage signal from high voltage transmission and distribution lines and convert the high voltage signal to a low voltage signal suitable for powering the loads.

Figure 1:
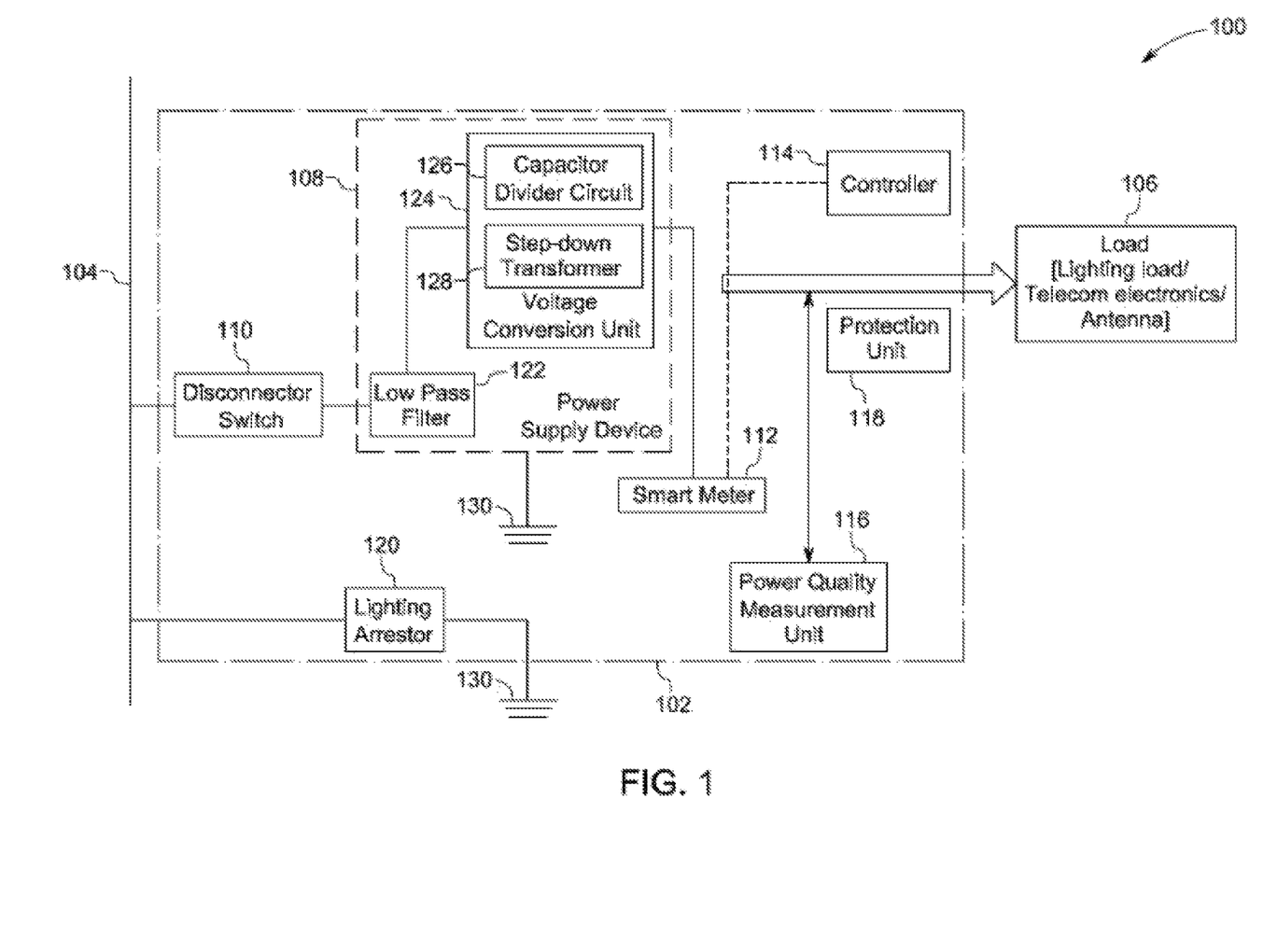
FIG. 1 is a block diagram of a power supply system according to aspects of the present specification.

FIG. 1 is a block diagram 100 of a power supply system 102 according to aspects of the present specification. In particular, the power supply system 102 includes a power supply system 102 coupled to a high voltage (HV) power line 104 and a load 106. The HV power line 104 is configured to provide a high voltage signal. The high voltage signal may range in kilo volt or mega volt range. A value of the high voltage signal may range from about 33 kilo volts (kV) to about 1200 kV. In one particular embodiment, the HV power line 104 is one of three phases of an AC power distribution line. The load 106 may include but not limited to a telecommunication antenna, a lighting load, or other telecommunication electronics.

The power supply system 102 includes a power supply device 108, a disconnector switch 110, a smart meter 112, a controller 114, a power quality measurement unit 116, a protection unit 118, and a lightning arrestor 120. As used herein, the term "controller" may refer to integrated circuits (ICs), a computer, a microcontroller, a microcomputer, a programmable logic controller (PLC), an application specific integrated circuit (ASIC), application-specific processors, digital signal processors (DSPs), field programmable gate arrays (FPGAs), and/or any other programmable circuits.

In the illustrated embodiment, the power supply device 108 is coupled to a ground terminal 130. The power supply device 108 includes a filter 122 and a voltage conversion unit 124. The voltage conversion unit 124 includes a capacitor divider circuit 126 and a transformer 128. The capacitor divider circuit 126 is coupled to the transformer 128. Further, the filter 122 is coupled to the voltage conversion unit 124.

Specifically, the filter 122 is coupled to the capacitor divider circuit 126 of the voltage conversion unit 124. In one embodiment, the filter 122 is a low pass filter. The capacitor divider circuit 126 includes a plurality of capacitors (not shown in FIG. 1) coupled to each other in series. The transformer 128 includes a primary winding and a secondary winding. In one embodiment, the transformer 128 is a step-down transformer.

In accordance with aspects of the present specification, the HV power line 104 is coupled to the power supply device 108 via the disconnector switch 110. In particular, the HV power line 104 is coupled to the filter 122 via the disconnector switch 110. The disconnector switch 110 includes at least one of a remotely operated switch, a manually operated switch, and a circuit breaker.

In one embodiment, the disconnector switch 110 is configured to de-couple the HV power line 104 from the power supply device 108. In particular, the disconnector switch 110 is configured to de-couple the power supply device 108 from the HV power line 104 in an event of maintenance of the power supply device 108 or the HV power line 104.

Further, a terminal at a secondary winding end of the transformer 128 is coupled to the load 106. In a specific embodiment, the smart meter 112, the controller 114, the power quality measurement unit 116, and the protection unit 118 are operatively coupled to the terminal at the secondary winding end of the transformer 128.

In one embodiment, a high voltage signal is provided from the HV power line 104 to the filter 122 via the disconnector switch 110 in a closed state. The filter 122 is configured to block high frequency component of the high voltage signal to generate a filtered high voltage signal. In one embodiment, the high frequency component is a high frequency signal. In one embodiment, the filtered high voltage signal has a frequency of 50 Hz. Further, the filtered high voltage signal is provided to the capacitor divider circuit 126. The plurality of capacitors of the capacitor divider circuit 126 is configured to divide the filtered high voltage signal to generate a divided filtered high voltage signal. In such an embodiment, the capacitor divider circuit 126 operates as a voltage divider. Further, the divided filtered high voltage signal across at least one of the plurality of capacitors of the capacitor divider circuit 126 is provided to the transformer 128. In particular, the divided filtered high voltage signal across at least one of the plurality of capacitors of the capacitor divider circuit 126 is provided to the primary winding of the transformer 128. The transformer 128 is configured to step down the divided filtered high voltage signal across at least one of the plurality of capacitors of the capacitor divider circuit 126 to a low voltage signal. The low voltage signal is obtained across the secondary winding of the transformer 128. In some embodiments, the value of the low voltage signal may range from about 110 volts to about 220 volts. Further, the low voltage signal is provided to the load 106. The load 106 is powered by the provided low voltage signal.

According to aspects of the present specification, a quality of the low voltage signal provided to the load 106, is monitored using the power quality measurement unit 116. In one embodiment, the power quality measurement unit 116 is a processor coupled to voltage/current/power sensors. In particular, the power quality measurement unit 116 is configured to measure high frequency component of the low voltage signal supplied to the load 106. In one embodiment, if the high frequency component of the low voltage signal is high compared to a reference limit, inductance of a plurality of inductors and capacitance of a plurality of capacitors of the filter 122 are modified. In one embodiment, the inductance of a plurality of inductors or capacitance of a plurality of capacitors of the filter 122 is modified by adding/removing a capacitor or an inductor from the filter 122, respectively. The modification of the inductance of a plurality of inductors or capacitance of a plurality of capacitors of the filter 122 improves filtering of high frequency component from the high voltage signal. This in turn aids in improving quality of high voltage signal provided to the voltage conversion unit 124. It should be noted herein that if the quality of the high voltage signal provided to the voltage conversion unit 124 is improved, the quality of the low voltage signal provided to the load 106 is also improved. Specifically, it should be noted herein that the improvement of quality of low voltage signal refers to reduction in high frequency component of the low voltage signal.

Further, the smart meter 112 is used to measure a quantity of electrical energy units consumed by the load 106. In one embodiment, the smart meter 112 is an electronic device that records consumption of the quantity of electric energy unit at regular intervals, for example, hourly basis. The intervals for recording consumptions of the quantity of electric energy may vary depending on the application. The smart meter 112 is configured to enable two-way communication with the controller 114. Communications between the smart meter 112 and the controller 114 may be performed via fixed wired connections or a wireless technique. The controller 114 is configured to process data output by the smart meter 112. In one embodiment, the controller 114 is configured to convey billing information to a customer based on the output from the smart meter 112. In one example, the customer may be a mobile service provider.

Furthermore, the lightning arrestor 120 is coupled to the HV power line 104 and the ground terminal 130. In one embodiment, the lightning arrestor is a spark gap, a block of a semiconducting material, such as silicon carbide or zinc oxide. In one embodiment, the lighting arrestor is gapped or gapless zinc oxide block. In another embodiment, the lighting arrestor may be a glow-discharge tube, a voltage-activated solid-state switches, such as varistors, and the like. In yet another embodiment, the lighting arrestor includes a porcelain tube several feet long and several inches in diameter, filled with discs of zinc oxide.

In accordance with aspects of the present specification, the lightning arrestor 120 is configured to protect the power supply device 108 from lightning and switching surges. Specifically, when a lightning and switching surge travels along the HV power line 104 to the power supply device 108, a current due to the lightning and switching surge is diverted through the lightning arrestor 120 to the ground terminal 130 thereby avoiding any damage to the power supply device 108.

The protection unit 118 is coupled to a terminal of the secondary winding of the transformer 128 and the ground terminal 130. In one embodiment, the protection unit 118 is a circuit breaker. In such an embodiment, the protection unit 118 is configured to trip during an over voltage condition of the power supply device 108. In another such embodiment, the protection unit 118 is configured to trip during a short circuit condition of the power supply device 108. The protection unit 118 is configured to provide additional protection to the power supply device 108.

Although in the illustrated embodiment, the controller 114 is depicted as a part of the power supply system 102, in another embodiment, the controller 114 may be a separate unit disposed external to the power supply system 102. Further, although the illustrated embodiment shows the power quality measurement unit 116 as a separate unit, in another embodiment, the power quality measurement unit 116 may be integral with the controller 114.

Figure 2:
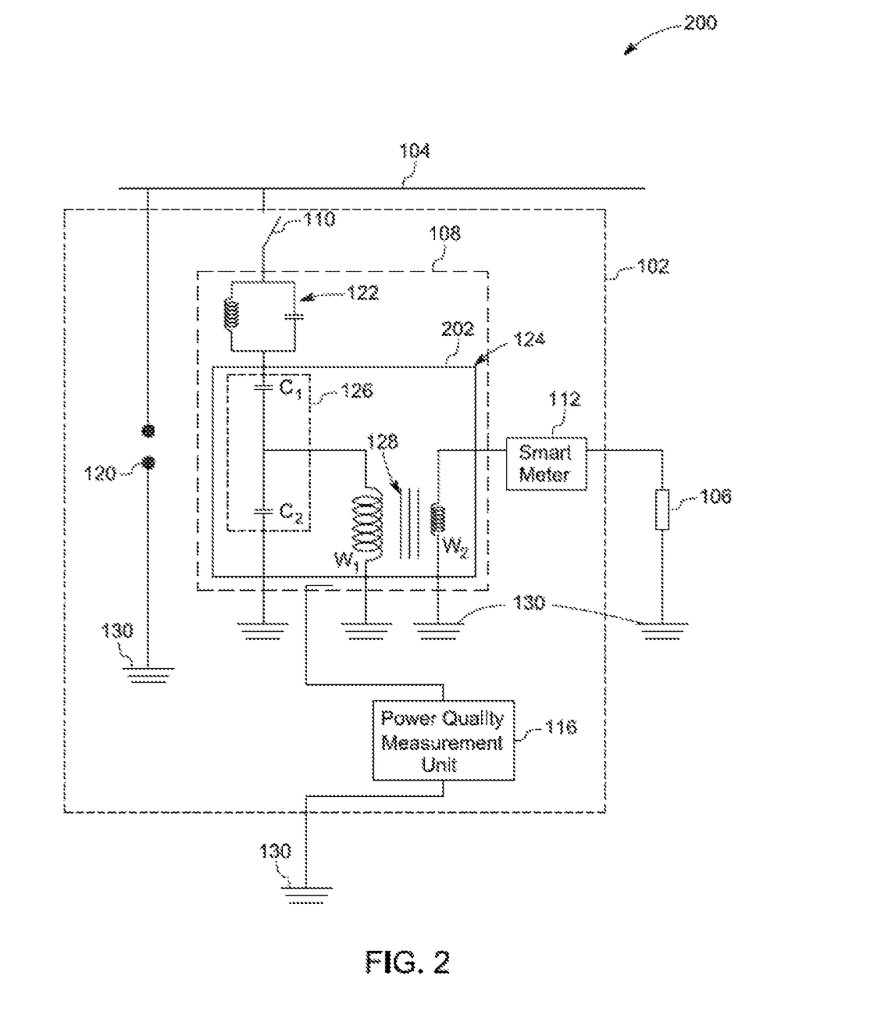
FIG. 2 is a circuit diagram of one embodiment of the power supply system according to aspects of the present specification.

Referring now to FIG. 2, a circuit diagram 200 of the power supply system 102 according to aspects of the present specification is shown. In particular, FIG. 2 represents a portion of the power supply system 102 coupled to the high voltage (HV) power line 104 and the load 106.

The power supply system 102 includes the power supply device 108, the disconnector switch 110, the smart meter 112, the power quality measurement unit 116, and the lightning arrestor 120. The power supply device 108 is coupled to the HV power line 104 via the disconnector switch 110.

The power supply device 108 includes the filter 122 and the voltage conversion unit 124. The filter 122 is coupled to the HV power line 104 via the disconnector switch 110. In one embodiment, the filter 122 is an inductor-capacitor (LC) filter. In another embodiment, the filter 122 is an inductor-capacitor-resistor (LCR) filter. In another embodiment, the filter 122 is a low pass filter.

The voltage conversion unit 124 includes the capacitor divider circuit 126 and the transformer 128. The capacitor divider circuit 126 includes a plurality of capacitors C1 and C2. The capacitor C1 is coupled in series with the capacitor C2. Further, the transformer 128 includes the primary winding W1 and the secondary winding W2. In one embodiment, the transformer 128 is a step-down transformer.

In the illustrated embodiment, the voltage conversion unit 124 is encompassed in a housing 202. In another embodiment, in addition to voltage conversion unit 124, the smart meter 112, the power quality measurement unit 116, and the filter 122 are disposed in the housing 202. In yet another embodiment, the smart meter 112 and the power quality measurement unit 116 may be disposed within different housings. The housing 202 is made of light weight material, such as a composite insulator housing, or a rubber insulator housing, or a porcelain housing. Further, the smart meter 112 is coupled at a terminal at the secondary winding W2 of the transformer 128. In one embodiment, disconnecting switches (not shown in FIG. 2) may be employed to disconnect the smart meter 112 from the secondary winding W2 of the transformer 128 for service and maintenance. The smart meter 112 is configured to measure quantity of energy units consumed by the load 106.

A high voltage signal from the HV power line 104, is provided to the filter 122 via the disconnector switch 110 in a closed state. The filtered high voltage signal from the filter 122, is provided to the capacitor divider circuit 126. The capacitor divider circuit 126 is configured to divide the filtered high voltage signal to generate a divided filtered high voltage signal. In one embodiment, the capacitance of the capacitor C1 is lesser than the capacitance of the capacitor C2. Therefore, the impedance of the capacitor C1 is higher than the impedance of the capacitor C2. Hence, the voltage across the capacitor C1 is higher than voltage across the capacitor C2.

In the illustrated embodiment, the voltage across the capacitor C2 is provided to the primary winding W1 of the transformer 128. The voltage is then stepped down and a low voltage signal is obtained across the secondary winding W2 of the transformer 128. In one embodiment, the value of the low voltage signal may be in a range of about 110 volts to about 220 volts. The low voltage signal across the secondary winding W2 is transmitted to the load 106. In one embodiment, the load 106 is a telecommunication antenna.

In one embodiment, the power quality measurement unit 116 is coupled to a terminal at the secondary winding W2 of the transformer 128. The quality of the low voltage signal provided to the load 106, is monitored using the power quality measurement unit 116. In particular, the power quality measurement unit 116 is configured to measure high frequency component of the low voltage signal provided to the load 106. In one embodiment, if the high frequency component of the low voltage signal is higher compared to a reference limit, inductance of the inductors and capacitance of the capacitors of the filter 122 are modified to improve quality of high voltage signal provided to the voltage conversion unit 124. In one embodiment, the inductance of a plurality of inductors or capacitance of a plurality of capacitors of the filter 122 is modified by adding/removing a capacitor or an inductor from the filter 122, respectively. The modification of the inductance of a plurality of inductors or capacitance of a plurality of capacitors of the filter 122 improves filtering of high frequency component from the high voltage signal. This aids in lowering the high frequency component in the high voltage signal and subsequently, the high frequency component in the low voltage signal provided to the load 106 is reduced. Thus, quality of the low voltage signal provided to the load 106 is improved.

Furthermore, the lightning arrestor 120 is coupled to the HV power line 104 and the ground terminal 130. The lightning arrestor 120 is configured to protect the power supply device 108 from lightning and switching surges.

Although the example of FIG. 2 represents a single-phase transformer, use of multiple-phase transformer is anticipated. Also, although the example of FIG. 2 depicts a single smart meter, use of multiple smart meters is envisaged.

Figure 3:
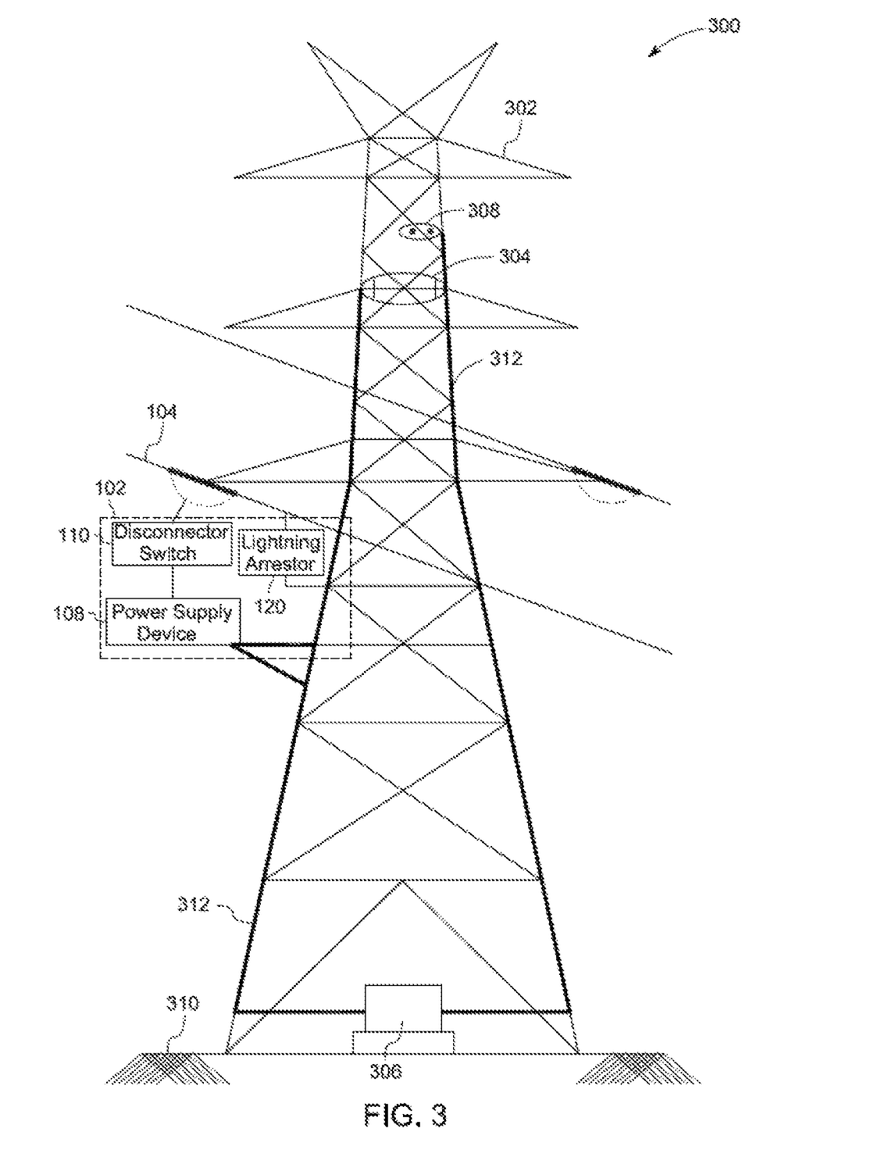
FIG. 3 is a schematic representation of one embodiment of the power supply system disposed on an electrical transmission and distribution tower according to aspects of the present specification.

FIG. 3 is a diagrammatical representation 300 of the power supply system 102 disposed on an electrical transmission and distribution (T&D) tower 302. In one embodiment, the electrical T&D tower 302 is a steel lattice tower. In another embodiment, the electrical T&D tower 302 is a wooden tower, a concrete tower, or the like. The electrical T&D tower 302 includes a plurality of connecting rods, brackets, and a plurality of support structures.

The electrical T&D tower 302 is configured to support overhead power lines, such as the HV power line 104. In one embodiment, the HV power line 104 is at least one of a high voltage alternating current (AC) line and a high voltage direct current (DC) line. The power supply system 102 includes the power supply device 108, the disconnector switch 110, and the lightning arrestor 120. The power supply device 108, the disconnector switch 110, and the lightning arrestor 120 are disposed on the electrical T&D tower 302, using brackets and other support structures. In one embodiment, the power supply device 108 may be disposed within a light weight housing.

The power supply device 108 is coupled to the HV power line 104 via the disconnector switch 110. The disconnector switch 110 is configured to de-couple the power supply device 108 from the HV power line 104 in the event of maintenance of the power supply device 108.

According to aspects of the present specification, a high voltage signal is provided from the HV power line 104 to the power supply device 108. Particularly, the high voltage signal is tapped from the HV power line 104 and provided to the power supply device 108 via the disconnector switch 110 in closed state. The power supply device 108 generates a low voltage signal based on the high voltage signal tapped from the HV power line 104. In particular, filter of the power supply device 108 blocks high frequency component in the high voltage signal and provides the filtered high voltage signal to the voltage conversion unit of the power supply device 108. Further, the voltage conversion unit converts the filtered high voltage signal to a low voltage signal.

In the illustrated embodiment, the low voltage signal is provided to a load, such as a telecommunication antenna 304, a base transmitting station 306, a dish antenna 308, and other telecommunication electronics (not shown in FIG. 3), using cables 312. The cables 312 are disposed along connecting rods of the electrical T&D tower 302. In one embodiment, the cables 312 are coupled to the connecting rods of the electrical T&D tower 302.

In one embodiment, the telecommunication antenna 304 is a Global System for Mobile (GSM) antenna. The telecommunication antenna 304 and the dish antenna 308 are disposed on the electrical T&D tower 302, using corresponding brackets. Further, the base transmitting station 306 is disposed on a ground surface 310 proximate to the electrical T&D tower 302.

In accordance with aspects of the present specification, the telecommunication antenna 304 is powered using the high voltage signal tapped from the HV power line 104 via the power supply system 102. Hence, the use of external power sources is avoided. As will be appreciated, the use of external power sources increases the footprint of a power supply system. Further, installation and maintenance of the external power sources is cumbersome.

Further, according to aspects of the present specification, since power is tapped from the HV power line 104 to the power the telecommunication antenna 304, for example, an uninterrupted power is provided to the telecommunication antenna 304. It may be noted that when external power sources are employed to power a telecommunication antenna, in certain scenarios, the external power sources may have to be shut down or may be subjected to faults. However, the HV power lines rarely fail and are only shut down only occasionally. In accordance with the aspects of the present specification, the HV power line 104 ensure continuous supply of power. Also, in remote locations where maintenance is difficult, use of the exemplary the power supply system 102 enables to provide uninterrupted power to the telecommunication antenna 304, for example.

Although the example of FIG. 3 describes a power supply system used for powering telecommunication equipment, in another embodiment, the power supply system may also be employed for powering lighting load.

Figure 4:
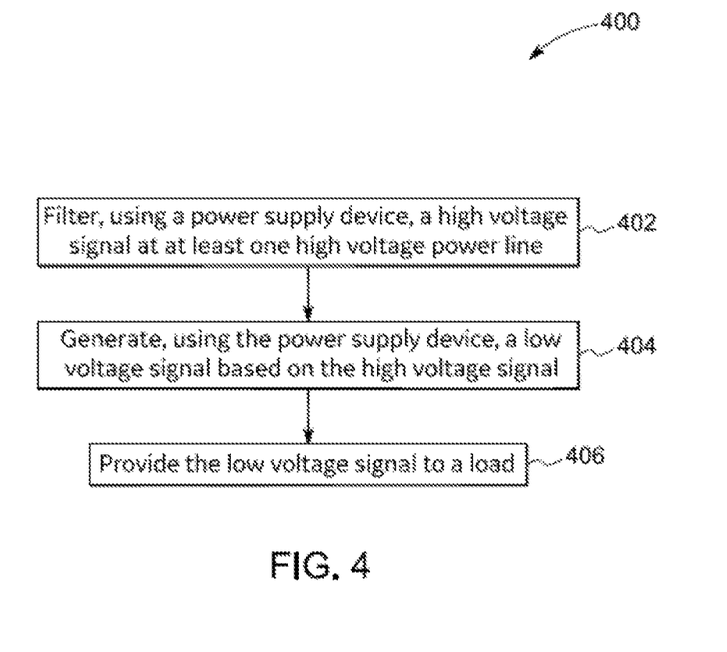
FIG. 4 is a flow chart representing a method of operation of the power supply system according to aspects of the present specification.

FIG. 4 is a flow chart representing a method 400 of operation of the power supply system of FIG. 1 according to aspects of the present specification. At step 402, a high voltage signal from the HV power line 104 is filtered using the power supply device 108. In particular, the filter 122 of the power supply device 108 is used to filter the high voltage signal from the HV power line 104. The filter 122 is used to block high frequency component of the high voltage signal. Subsequently, the filtered high voltage signal is provided to the voltage conversion unit 124.

At step 404, a low voltage signal is generated based on the high voltage signal, using the power supply device 108. In particular, the filtered high voltage signal is converted to the low voltage signal using the voltage conversion unit 124 of the power supply device 108.

In accordance with aspects of the present specification, the filtered high voltage signal is provided to the capacitor divider circuit 126. A plurality of capacitors of the capacitor divider circuit 126 divides the filtered high voltage signal to generate a divided filtered high voltage signal. Further, the divided filtered high voltage signal across at least one of the plurality of capacitors of the capacitor divider circuit 126 is provided to the transformer 128. In particular, the divided filtered high voltage signal across at least one of the plurality of capacitors of the capacitor divider circuit 126 is provided to the primary winding of the transformer 128. The transformer 128 steps down the divided filtered high voltage signal across at least one of the plurality of capacitors of the capacitor divider circuit 126 to generate the low voltage signal.

Furthermore, at step 406, the low voltage signal is provided to the load 106. In one embodiment, the load 106 includes at least one of a telecommunication antenna, telecommunication electronics, and lighting load. The load 106 is energized based on the low voltage signal provided to the load 106.

Furthermore, the foregoing examples, demonstrations, and process steps such as those that may be performed by the system may be implemented by suitable code on a processor-based system, such as a general-purpose or special-purpose computer. It should also be noted that different implementations of the present technique may perform some or all of the steps described herein in different orders or substantially concurrently, that is, in parallel. Furthermore, the functions may be implemented in a variety of programming languages, including but not limited to C++ or Java. Such code may be stored or adapted for storage on one or more tangible, machine readable media, such as on data repository chips, local or remote hard disks, optical disks (i.e., CDs or DVDs), memory or other media, which may be accessed by a processor-based system to execute the stored code. Note that the tangible media may include paper or another suitable medium upon which the instructions are printed. For instance, the instructions may be electronically captured via optical scanning of the paper or other medium, then compiled, interpreted or otherwise processed in a suitable manner if necessary, and then stored in the data repository or memory.

The exemplary power supply system may be employed for powering of loads, such as but not limited to telecommunication antennas, other telecommunication electronics, lighting loads, and the like. Hence, the use of an external source of power for such applications is avoided. Further, the power supply system provides uninterrupted supply of power to the loads, such as telecommunication antennas thereby aiding in maintaining continuous mobile communication even in remote areas.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof.

I claim:

1. A power supply system configured to tap a high voltage signal from at least one high voltage power line and convert the high voltage signal to a low voltage signal suitable for powering a load, the power supply system comprising a power supply device comprising:
   a voltage conversion unit comprising:
      a capacitor divider circuit comprising a plurality of capacitors coupled to each other in series; and
      a step-down transformer coupled to at least one of the plurality of capacitors; and
   a low pass filter configured to be coupled to at least one high voltage power line and the capacitor divider circuit of the voltage conversion unit, wherein the low pass filter is configured to provide filtered power to the capacitor divider circuit.

2. The power supply system in claim 1, further comprising a housing encompassing the voltage conversion unit.

3. The power supply system in claim 2, wherein the housing is at least one of a composite insulator housing and a porcelain housing.

4. The power supply system in claim 1, wherein the voltage conversion unit configured to be disposed on an electrical transmission and distribution tower.

5. The power supply system in claim 1, further comprising:
   a disconnector switch disposed between the power supply device and the at least one high voltage power line; and
   a smart meter coupled to the voltage conversion unit.

6. The power supply system in claim 5, wherein the disconnector switch comprises at least one of a remotely operated switch, a circuit breaker, and a manually operated switch.

7. The power supply system in claim 5, wherein the smart meter is coupled to one winding of the step-down transformer.

8. The power supply system in claim 5, wherein the smart meter is configured to measure electrical energy units consumed by the load.

9. The power supply system in claim 5, wherein the smart meter and the disconnector switch are configured to be disposed on an electrical transmission and distribution tower.

10. The power supply system in claim 1, further comprising a power quality measurement unit coupled to the voltage conversion unit.

11. The power supply system in claim 1, wherein the power supply device is coupled to the load and configured to provide the low voltage signal to the load.

12. The power supply system in claim 11, further comprising: a smart meter configured to measure electrical energy units consumed by the load.

13. The power supply system in claim 12, wherein the smart meter is coupled to a controller, wherein the controller is configured to process data output by the smart meter.

14. The power supply system in claim 1, wherein the power supply device is configured to be disposed on an electrical transmission and distribution tower.

15. The power supply system in claim 1, further comprising a lightning arrestor coupled across the power supply device.

16. The power supply system in claim 15, wherein, the lightning arrestor is configured to be disposed on an electrical transmission and distribution tower.

17. A method of operation of a power supply system configured to tap a high voltage signal from at least one high voltage power line and convert the high voltage signal to a low voltage signal suitable for powering a load, the method comprising:
   filtering, using a power supply device, the high voltage signal at at least one high voltage power line, wherein the filtered high voltage signal is an upstream signal to a capacitor divider circuit of the power supply device;
   generating, using the power supply device, the low voltage signal based on the filtered high voltage signal; and
   providing the low voltage signal to the load.

18. The method in claim 17, further comprising measuring, using a smart meter, electrical energy units consumed by the load.

19. The method in claim 18, further comprising processing, using a controller, data output by the smart meter.

20. The method in claim 17, further comprising measuring, using a power quality measurement unit, high frequency component corresponding to the low voltage signal.

* * * * *